US007157036B2

(12) United States Patent
Choi et al.

(10) Patent No.: US 7,157,036 B2
(45) Date of Patent: Jan. 2, 2007

(54) METHOD TO REDUCE ADHESION BETWEEN A CONFORMABLE REGION AND A PATTERN OF A MOLD

(75) Inventors: Byung Jin Choi, Round Rock, TX (US); Frank Y. Xu, Austin, TX (US); Nicholas A. Stacey, Austin, TX (US); Van Xuan Hong Truskett, Austin, TX (US); Michael P. C. Watts, Austin, TX (US)

(73) Assignees: Molecular Imprints, Inc, Austin, TX (US); University of Texas Systems, Austin, TX (US)

( * ) Notice: Subject to any disclaimer, the term of this patent is extended or adjusted under 35 U.S.C. 154(b) by 179 days.

(21) Appl. No.: 10/463,396

(22) Filed: Jun. 17, 2003

(65) Prior Publication Data

US 2004/0256764 A1    Dec. 23, 2004

(51) Int. Cl.
*B29C 59/00*    (2006.01)
*B29C 33/60*    (2006.01)

(52) U.S. Cl. ...................... 264/264; 264/300
(58) Field of Classification Search ............... 264/264, 264/300, 296, 220–227
See application file for complete search history.

(56) References Cited

U.S. PATENT DOCUMENTS

| | | |
|---|---|---|
| 3,527,062 A | 9/1970 | Bilinski et al. |
| 3,783,520 A | 1/1974 | King |
| 3,807,027 A | 4/1974 | Heisler |
| 3,807,029 A | 4/1974 | Troeger |
| 3,810,874 A | 5/1974 | Mitsch et al. |
| 3,811,665 A | 5/1974 | Seelig |
| 3,919,351 A | 11/1975 | Chang et al. |
| 4,062,600 A | 12/1977 | Wyse |
| 4,070,116 A | 1/1978 | Frosch et al. |
| 4,098,001 A | 7/1978 | Watson |
| 4,119,688 A | 10/1978 | Hiraoka |
| 4,155,169 A | 5/1979 | Drake et al. |
| 4,201,800 A | 5/1980 | Alcorn et al. |

(Continued)

FOREIGN PATENT DOCUMENTS

DE    2800476    7/1978

(Continued)

OTHER PUBLICATIONS

S. Y. Chou et al., "Nanoimprint Lithography," Journal of Vacuum Science Technology, B 14 (1996), pp. 4129-4133.*

(Continued)

*Primary Examiner*—Michael P. Colaianni
*Assistant Examiner*—Patrick Butler
(74) *Attorney, Agent, or Firm*—Winstead Sechrest & Minick P.C.; Kenneth C. Brooks (57) ABSTRACT

The present invention provides a method to reduce adhesion between a conformable region on a substrate and a pattern of a mold, which selectively comes into contact with the conformable region. The method features forming a conformable material on the substrate and contacting the conformable material with the surface. A conditioned layer is formed from the conformable material. The conditioned layer has first and second sub-portions, with the first sub-portion being solidified and the second sub-portion having a first affinity for the surface and a second affinity for the first sub-portion. The first affinity is greater than the second affinity. In this fashion, upon separation of the mold from the conditioned layer, a subset of the second sub-portion maintains contact with the mold, thereby reducing the probability that a pattern formed in the conditioned layer becomes compromised. These and other embodiments are described herein.

14 Claims, 4 Drawing Sheets

U.S. PATENT DOCUMENTS

| | | |
|---|---|---|
| 4,202,107 A | 5/1980 | Watson |
| 4,267,212 A | 5/1981 | Sakawaki |
| 4,271,258 A | 6/1981 | Watariguchi |
| 4,326,805 A | 4/1982 | Feldman et al. |
| 4,337,579 A | 7/1982 | De Fazio |
| 4,355,469 A | 10/1982 | Nevins et al. |
| 4,414,750 A | 11/1983 | De Fazio |
| 4,426,247 A | 1/1984 | Tamamura et al. |
| 4,440,804 A | 4/1984 | Milgram |
| 4,451,507 A | 5/1984 | Beltz et al. |
| 4,507,331 A | 3/1985 | Hiraoka |
| 4,512,848 A | 4/1985 | Deckman et al. |
| 4,514,439 A | 4/1985 | Rounds |
| 4,517,337 A | 5/1985 | Lockhart et al. |
| 4,544,572 A | 10/1985 | Sandvig et al. |
| 4,552,832 A | 11/1985 | Blume et al. |
| 4,552,833 A | 11/1985 | Ito et al. |
| 4,600,309 A | 7/1986 | Fay |
| 4,610,442 A | 9/1986 | Oku et al. |
| 4,614,667 A | 9/1986 | Larson et al. |
| 4,617,238 A | 10/1986 | Crivello et al. |
| 4,657,845 A | 4/1987 | Frechet et al. |
| 4,687,707 A | 8/1987 | Matsuo et al. |
| 4,692,205 A | 9/1987 | Sachdev et al. |
| 4,694,703 A | 9/1987 | Routson |
| 4,707,218 A | 11/1987 | Giammarco et al. |
| 4,722,878 A | 2/1988 | Watakabe et al. |
| 4,724,222 A | 2/1988 | Feldman |
| 4,731,155 A | 3/1988 | Napoli et al. |
| 4,737,425 A | 4/1988 | Lin et al. |
| 4,763,886 A | 8/1988 | Takei |
| 4,808,511 A | 2/1989 | Holmes |
| 4,826,943 A | 5/1989 | Ito et al. |
| 4,846,931 A | 7/1989 | Gmitter et al. |
| 4,848,911 A | 7/1989 | Uchida et al. |
| 4,857,477 A | 8/1989 | Kanamori |
| 4,883,561 A | 11/1989 | Gmitter et al. |
| 4,891,303 A | 1/1990 | Garza et al. |
| 4,908,298 A | 3/1990 | Hefferon et al. |
| 4,919,748 A | 4/1990 | Bredbenner et al. |
| 4,921,778 A | 5/1990 | Thackeray et al. |
| 4,929,083 A | 5/1990 | Brunner |
| 4,931,351 A | 6/1990 | McColgin et al. |
| 4,959,252 A | 9/1990 | Bonnebat et al. |
| 4,964,945 A | 10/1990 | Calhoun |
| 4,976,818 A | 12/1990 | Hashimoto et al. |
| 4,980,316 A | 12/1990 | Huebner |
| 4,988,274 A | 1/1991 | Kenmochi |
| 4,999,280 A | 3/1991 | Hiraoka |
| 5,028,366 A | 7/1991 | Harakal et al. |
| 5,053,318 A | 10/1991 | Gulla et al. |
| 5,063,321 A | 11/1991 | Carter |
| 5,071,694 A | 12/1991 | Uekita et al. |
| 5,072,126 A | 12/1991 | Progler |
| 5,073,230 A | 12/1991 | Maracas et al. |
| 5,074,667 A | 12/1991 | Miyatake |
| 5,108,875 A | 4/1992 | Thackeray et al. |
| 5,110,514 A | 5/1992 | Soane |
| 5,126,006 A | 6/1992 | Cronin et al. |
| 5,148,036 A | 9/1992 | Matsugu et al. |
| 5,148,037 A | 9/1992 | Suda et al. |
| 5,151,754 A | 9/1992 | Ishibashi et al. |
| 5,169,494 A | 12/1992 | Hashimoto et al. |
| 5,173,393 A | 12/1992 | Sezi et al. |
| 5,179,863 A | 1/1993 | Uchida et al. |
| 5,198,326 A | 3/1993 | Hashimoto et al. |
| 5,204,381 A | 4/1993 | Zeigler |
| 5,204,739 A | 4/1993 | Domenicali |
| 5,206,983 A | 5/1993 | Guckel et al. |
| 5,212,147 A | 5/1993 | Sheats |
| 5,234,793 A | 8/1993 | Sebald et al. |
| 5,240,550 A | 8/1993 | Boehnke et al. |
| 5,240,878 A | 8/1993 | Fitzsimmons et al. |
| 5,242,711 A | 9/1993 | DeNatale et al. |
| 5,244,818 A | 9/1993 | Jokerst et al. |
| 5,259,926 A | 11/1993 | Kuwabara et al. |
| 5,270,984 A | 12/1993 | Mine |
| 5,277,749 A | 1/1994 | Griffith et al. |
| 5,298,556 A | 3/1994 | Stephens |
| 5,314,731 A | 5/1994 | Yoneda et al. |
| 5,314,772 A | 5/1994 | Kozicki et al. |
| 5,318,870 A | 6/1994 | Hartney |
| 5,324,683 A | 6/1994 | Fitch et al. |
| 5,328,810 A | 7/1994 | Lowrey et al. |
| 5,330,881 A | 7/1994 | Sidman et al. |
| 5,331,020 A | 7/1994 | Brown et al. |
| 5,348,616 A | 9/1994 | Hartman et al. |
| 5,362,606 A | 11/1994 | Hartney et al. |
| 5,366,851 A | 11/1994 | Novembre |
| 5,369,722 A | 11/1994 | Heming et al. |
| 5,374,454 A | 12/1994 | Bickford et al. |
| 5,376,810 A | 12/1994 | Hoenk et al. |
| 5,380,474 A | 1/1995 | Rye et al. |
| 5,389,696 A | 2/1995 | Dempsey et al. |
| 5,392,123 A | 2/1995 | Marcus et al. |
| 5,417,802 A | 5/1995 | Obeng |
| 5,421,981 A | 6/1995 | Leader et al. |
| 5,422,295 A | 6/1995 | Choi et al. |
| 5,424,549 A | 6/1995 | Feldman |
| 5,425,848 A | 6/1995 | Haisma et al. |
| 5,425,964 A | 6/1995 | Southwell et al. |
| 5,431,777 A | 7/1995 | Austin et al. |
| 5,439,766 A | 8/1995 | Day et al. |
| 5,452,090 A | 9/1995 | Progler et al. |
| 5,453,157 A | 9/1995 | Jeng |
| 5,458,520 A | 10/1995 | DeMercurio et al. |
| 5,468,542 A | 11/1995 | Crouch |
| 5,480,047 A | 1/1996 | Tanigawa et al. |
| 5,482,768 A | 1/1996 | Kawasato et al. |
| 5,512,131 A | 4/1996 | Kumar et al. |
| 5,515,167 A | 5/1996 | Ledger et al. |
| 5,523,878 A | 6/1996 | Wallace et al. |
| 5,527,662 A | 6/1996 | Hashimoto et al. |
| 5,542,978 A | 8/1996 | Kindt-Larsen et al. |
| 5,545,367 A | 8/1996 | Bae et al. |
| 5,566,584 A | 10/1996 | Briganti |
| 5,594,042 A | 1/1997 | Glover et al. |
| 5,601,641 A | 2/1997 | Stephens |
| 5,629,095 A | 5/1997 | Bujanowski et al. |
| 5,633,505 A | 5/1997 | Chung et al. |
| 5,654,238 A | 8/1997 | Cronin et al. |
| 5,669,303 A | 9/1997 | Maracas et al. |
| 5,670,415 A | 9/1997 | Rust |
| 5,700,626 A | 12/1997 | Lee et al. |
| 5,723,176 A | 3/1998 | Keyworth et al. |
| 5,724,145 A | 3/1998 | Kondo et al. |
| 5,725,788 A | 3/1998 | Maracas et al. |
| 5,736,424 A | 4/1998 | Prybyla et al. |
| 5,743,998 A | 4/1998 | Park |
| 5,747,102 A | 5/1998 | Smith et al. |
| 5,753,014 A | 5/1998 | Van Rijn |
| 5,760,500 A | 6/1998 | Kondo et al. |
| 5,772,905 A | 6/1998 | Chou |
| 5,776,748 A | 7/1998 | Singhvi et al. |
| 5,779,799 A | 7/1998 | Davis |
| 5,802,914 A | 9/1998 | Fassler et al. |
| 5,820,769 A | 10/1998 | Chou |
| 5,837,314 A | 11/1998 | Beaton et al. |
| 5,849,209 A | 12/1998 | Kindt-Larsen et al. |
| 5,849,222 A | 12/1998 | Jen et al. |
| 5,855,686 A | 1/1999 | Rust |
| 5,861,467 A | 1/1999 | Bujanowski et al. |
| 5,877,036 A | 3/1999 | Kawai |
| 5,877,861 A | 3/1999 | Ausschnitt et al. |

| | | | | | | |
|---|---|---|---|---|---|---|
| 5,888,650 | A | 3/1999 | Calhoun et al. | 6,541,360 | B1 | 4/2003 | Plat et al. |
| 5,895,263 | A | 4/1999 | Carter et al. | 6,544,594 | B1 | 4/2003 | Linford et al. |
| 5,900,160 | A | 5/1999 | Whitesides et al. | 6,561,706 | B1 | 5/2003 | Singh et al. |
| 5,905,104 | A | 5/1999 | Eklund et al. | 6,565,776 | B1 | 5/2003 | Li et al. |
| 5,907,782 | A | 5/1999 | Wu | 6,565,928 | B1 | 5/2003 | Sakamoto et al. |
| 5,912,049 | A | 6/1999 | Shirley | 6,580,172 | B1 | 6/2003 | Mancini et al. |
| 5,926,690 | A | 7/1999 | Toprac et al. | 6,583,248 | B1 | 6/2003 | Bowen |
| 5,937,758 | A | 8/1999 | Maracas et al. | 6,600,207 | B1 | 7/2003 | Huang et al. |
| 5,942,871 | A | 8/1999 | Lee | 6,632,742 | B1 | 10/2003 | Yang et al. |
| 5,948,219 | A | 9/1999 | Rohner | 6,635,581 | B1 | 10/2003 | Wong |
| 5,948,470 | A | 9/1999 | Harrison et al. | 6,646,662 | B1 | 11/2003 | Nebashi et al. |
| 5,948,570 | A | 9/1999 | Kornblit et al. | 6,649,272 | B1 | 11/2003 | Moore et al. |
| 5,952,127 | A | 9/1999 | Yamanaka | 6,664,306 | B1 | 12/2003 | Gaddam et al. |
| 5,956,216 | A | 9/1999 | Chou | 6,677,252 | B1 | 1/2004 | Marsh |
| 6,033,977 | A | 3/2000 | Gutsche et al. | 6,696,157 | B1 | 2/2004 | David et al. |
| 6,035,805 | A | 3/2000 | Rust | 6,696,220 | B1 | 2/2004 | Bailey et al. |
| 6,038,280 | A | 3/2000 | Rossiger et al. | 6,703,190 | B1 | 3/2004 | Elian |
| 6,039,897 | A | 3/2000 | Lochhead et al. | 6,713,238 | B1 | 3/2004 | Chou et al. |
| 6,046,056 | A | 4/2000 | Parce et al. | 6,716,767 | B1 | 4/2004 | Shih et al. |
| 6,051,345 | A | 4/2000 | Huang | 6,719,915 | B1 | 4/2004 | Willson et al. |
| 6,066,269 | A | 5/2000 | Wei et al. | 6,721,529 | B1 | 4/2004 | Chen et al. |
| 6,074,827 | A | 6/2000 | Nelson et al. | 6,730,256 | B1 | 5/2004 | Bloomstein et al. |
| 6,091,485 | A | 7/2000 | Li et al. | 6,737,202 | B1 | 5/2004 | Gehoski et al. |
| 6,096,655 | A | 8/2000 | Lee et al. | 6,737,489 | B1 | 5/2004 | Linert et al. |
| 6,114,404 | A | 9/2000 | Deeken et al. | 6,743,713 | B1 | 6/2004 | Mukherjee-Roy et al. |
| 6,117,708 | A | 9/2000 | Wensel | 6,767,983 | B1 | 7/2004 | Fujiyama et al. |
| 6,125,183 | A | 9/2000 | Jiawook et al. | 6,770,852 | B1 | 8/2004 | Steger |
| 6,128,085 | A | 10/2000 | Buermann et al. | 6,774,183 | B1 | 8/2004 | Palumbo et al. |
| 6,132,632 | A | 10/2000 | Haney et al. | 6,776,094 | B1 | 8/2004 | Whitesides et al. |
| 6,143,412 | A | 11/2000 | Schueller et al. | 6,777,170 | B1 | 8/2004 | Bloomstein et al. |
| 6,150,231 | A | 11/2000 | Muller et al. | 6,790,905 | B1 | 9/2004 | Fitzgerald et al. |
| 6,150,680 | A | 11/2000 | Eastman et al. | 6,802,870 | B1 | 10/2004 | Chang et al. |
| 6,168,845 | B1 | 1/2001 | Fontana, Jr. et al. | 6,809,356 | B1 | 10/2004 | Chou |
| 6,174,931 | B1 | 1/2001 | Moon et al. | 6,828,244 | B1 | 12/2004 | Chou |
| 6,180,239 | B1 | 1/2001 | Whitesides et al. | 6,830,819 | B1 | 12/2004 | Kaplan et al. |
| 6,188,150 | B1 | 2/2001 | Spence | 6,849,558 | B1 | 2/2005 | Schaper |
| 6,190,929 | B1 | 2/2001 | Wang et al. | 6,900,881 | B1 | 5/2005 | Sreenivasan et al. |
| 6,204,343 | B1 | 3/2001 | Barucha et al. | 6,908,861 | B1 | 6/2005 | Sreenivasan et al. |
| 6,204,922 | B1 | 3/2001 | Chalmers | 6,916,584 | B1 | 7/2005 | Sreenivasan et al. |
| 6,218,316 | B1 | 4/2001 | Marsh | 6,932,934 | B1 | 8/2005 | Choi et al. |
| 6,245,581 | B1 | 6/2001 | Bonser et al. | 6,936,194 | B1 | 8/2005 | Watts |
| 6,274,294 | B1 | 8/2001 | Hines | 2001/0044075 | A1 | 11/2001 | Nishimura et al. |
| 6,309,580 | B1 * | 10/2001 | Chou ..................... 264/338 | 2002/0042027 | A1 | 4/2002 | Chou et al. |
| 6,316,290 | B1 | 11/2001 | Wensel | 2002/0093122 | A1 | 7/2002 | Choi et al. |
| 6,326,627 | B1 | 12/2001 | Putvinski et al. | 2002/0094496 | A1 | 7/2002 | Choi et al. |
| 6,329,256 | B1 | 12/2001 | Ibok | 2002/0098426 | A1 | 7/2002 | Sreenivasan et al. |
| 6,334,960 | B1 | 1/2002 | Willson et al. | 2002/0132482 | A1 | 9/2002 | Chou |
| 6,335,149 | B1 | 1/2002 | Xu et al. | 2002/0135099 | A1 * | 9/2002 | Robinson et al. ........... 264/236 |
| 6,342,097 | B1 | 1/2002 | Terry et al. | 2002/0150398 | A1 | 10/2002 | Choi et al. |
| 6,344,105 | B1 | 2/2002 | Daugherty et al. | 2002/0167117 | A1 | 11/2002 | Chou |
| 6,355,198 | B1 | 3/2002 | Kim et al. | 2002/0177319 | A1 | 11/2002 | Chou |
| 6,383,928 | B1 | 5/2002 | Eissa | 2003/0034329 | A1 | 2/2003 | Chou |
| 6,387,783 | B1 | 5/2002 | Furukawa et al. | 2003/0062334 | A1 | 4/2003 | Lee et al. |
| 6,388,253 | B1 | 5/2002 | Su | 2003/0080471 | A1 | 5/2003 | Chou |
| 6,391,217 | B1 | 5/2002 | Schaffer et al. | 2003/0080472 | A1 | 5/2003 | Chou |
| 6,391,798 | B1 | 5/2002 | DeFelice et al. | 2003/0081193 | A1 | 5/2003 | White et al. |
| 6,411,010 | B1 | 6/2002 | Suzuki et al. | 2003/0113638 | A1 | 6/2003 | Mancini et al. |
| 6,447,919 | B1 | 9/2002 | Brown et al. | 2003/0129542 | A1 | 7/2003 | Shih et al. |
| 6,455,411 | B1 | 9/2002 | Jiang et al. | 2003/0166814 | A1 | 9/2003 | Sparrowe et al. |
| 6,467,761 | B1 | 10/2002 | Amatucci et al. | 2003/0205657 | A1 | 11/2003 | Voisin |
| 6,468,642 | B1 | 10/2002 | Bray et al. | 2003/0205658 | A1 | 11/2003 | Voisin |
| 6,468,896 | B1 | 10/2002 | Rohr et al. | 2003/0215577 | A1 | 11/2003 | Willson et al. |
| 6,475,704 | B1 | 11/2002 | Iwasaki et al. | 2003/0235787 | A1 | 12/2003 | Watts et al. |
| 6,482,742 | B1 | 11/2002 | Chou | 2004/0007799 | A1 | 1/2004 | Choi et al. |
| 6,489,068 | B1 | 12/2002 | Kye | 2004/0008334 | A1 | 1/2004 | Sreenivasan et al. |
| 6,495,624 | B1 | 12/2002 | Brown | 2004/0009673 | A1 | 1/2004 | Sreenivasan et al. |
| 6,503,914 | B1 | 1/2003 | Benish et al. | 2004/0010341 | A1 | 1/2004 | Watts et al. |
| 6,514,672 | B1 | 2/2003 | Young et al. | 2004/0021254 | A1 | 2/2004 | Sreenivasan et al. |
| 6,517,995 | B1 | 2/2003 | Jacobenson et al. | 2004/0021866 | A1 | 2/2004 | Watts et al. |
| 6,518,168 | B1 | 2/2003 | Clem et al. | 2004/0022888 | A1 | 2/2004 | Sreenivasan et al. |
| 6,518,189 | B1 | 2/2003 | Chou | 2004/0029041 | A1 | 2/2004 | Shih et al. |
| 6,534,418 | B1 | 3/2003 | Plat et al. | 2004/0036201 | A1 | 2/2004 | Chou et al. |
| 6,541,356 | B1 | 4/2003 | Fogel et al. | 2004/0046271 | A1 | 3/2004 | Watts |

| | | |
|---|---|---|
| 2004/0046288 A1 | 3/2004 | Chou |
| 2004/0053146 A1 | 3/2004 | Sreenivasan et al. |
| 2004/0065252 A1 | 4/2004 | Sreenivasan et al. |
| 2004/0065976 A1 | 4/2004 | Sreenivasan et al. |
| 2004/0086793 A1 | 5/2004 | Sreenivasan et al. |
| 2004/0089979 A1 | 5/2004 | Rubin |
| 2004/0090611 A1 | 5/2004 | Choi et al. |
| 2004/0104641 A1 | 6/2004 | Choi et al. |
| 2004/0110856 A1 | 6/2004 | Young et al. |
| 2004/0112861 A1 | 6/2004 | Choi et al. |
| 2004/0112862 A1 | 6/2004 | Willson et al. |
| 2004/0116548 A1 | 6/2004 | Willson et al. |
| 2004/0118809 A1 | 6/2004 | Chou et al. |
| 2004/0124566 A1 | 7/2004 | Sreenivasan et al. |
| 2004/0131718 A1 | 7/2004 | Chou et al. |
| 2004/0137734 A1 | 7/2004 | Chou et al. |
| 2004/0141163 A1 | 7/2004 | Bailey et al. |
| 2004/0141168 A1 | 7/2004 | Sreenivasan et al. |
| 2004/0149687 A1 | 8/2004 | Choi et al. |
| 2004/0156108 A1 | 8/2004 | Chou et al. |
| 2004/0163563 A1 | 8/2004 | Sreenivasan et al. |
| 2004/0168586 A1 | 9/2004 | Bailey et al. |
| 2004/0168588 A1 | 9/2004 | Choi et al. |
| 2004/0168613 A1 | 9/2004 | Nguyen |
| 2004/0169441 A1 | 9/2004 | Choi et al. |
| 2004/0170770 A1 | 9/2004 | Nguyen |
| 2004/0170771 A1 | 9/2004 | Bailey et al. |
| 2004/0188381 A1 | 9/2004 | Sreenivasan et al. |
| 2004/0189994 A1 | 9/2004 | Sreenivasan et al. |
| 2004/0189996 A1 | 9/2004 | Sreenivasan et al. |
| 2004/0192041 A1 | 9/2004 | Jeong et al. |
| 2004/0197843 A1 | 10/2004 | Chou et al. |
| 2004/0200411 A1 | 10/2004 | Willson et al. |
| 2004/0202865 A1 | 10/2004 | Homola et al. |
| 2004/0202872 A1 | 10/2004 | Fang et al. |
| 2004/0209177 A1 | 10/2004 | Sreenivasan et al. |
| 2004/0241338 A1 | 12/2004 | Foster et al. |
| 2004/0250945 A1 | 12/2004 | Zheng et al. |
| 2005/0037143 A1 | 2/2005 | Chou et al. |
| 2005/0051698 A1 | 3/2005 | Sreenivasan et al. |
| 2005/0084804 A1 | 4/2005 | Truskett et al. |
| 2005/0100830 A1 | 5/2005 | Xu et al. |
| 2005/0106321 A1 | 5/2005 | McMackin et al. |
| 2005/0118749 A1 | 6/2005 | Sakamoto et al. |
| 2005/0156357 A1 | 7/2005 | Willson et al. |
| 2005/0160011 A1 | 7/2005 | Sreenivasan et al. |
| 2005/0160934 A1 | 7/2005 | Xu et al. |

FOREIGN PATENT DOCUMENTS

| | | |
|---|---|---|
| DE | 19648844 | 9/1997 |
| EP | 0244884 | 3/1987 |
| EP | 733455 | 9/1996 |
| JP | 55-88332 | 7/1980 |
| JP | 57-7931 | 1/1982 |
| JP | 63-138730 | 6/1988 |
| JP | 1-196749 | 8/1989 |
| JP | 02-24848 | 1/1990 |
| JP | 02-92603 | 4/1990 |
| WO | WO 87/02935 | 5/1987 |
| WO | WO 92/17883 | 10/1992 |
| WO | WO 98/10121 | 3/1998 |
| WO | WO 99/05724 A1 | 2/1999 |
| WO | WO 99/45753 | 9/1999 |
| WO | WO 99/63535 | 12/1999 |
| WO | WO 00/21689 | 4/2000 |
| WO | WO 00/54107 | 9/2000 |
| WO | WO 01/33232 | 5/2001 |
| WO | WO 01/33300 | 5/2001 |
| WO | WO 01/47003 A2 | 6/2001 |
| WO | WO 01/53889 | 7/2001 |
| WO | WO 01/69317 | 9/2001 |
| WO | WO 01/79589 | 10/2001 |
| WO | WO 01/79592 | 10/2001 |
| WO | WO 01/90816 | 11/2001 |
| WO | WO 02/07199 A1 | 1/2002 |
| WO | WO 03/010289 A2 | 2/2003 |
| WO | WO 03/079416 A1 | 9/2003 |
| WO | WO 03/099536 A1 | 12/2003 |
| WO | WO 2004/044651 | 5/2004 |
| WO | WO 2004/114016 A2 | 12/2004 |

OTHER PUBLICATIONS

Haisma et al., "Mold-Assited Nanolithography: A Process for Reliable Pattern Replication", Journal of Vacuum Science and Technology, Nov./Dec. 1996, pp. 4214-4128, vol. B 14(6).
Chou et al., "Imprint Lithography with Sub-10nm Feature Size and High Throughput", Microelectronic Engineering, 1997, pp. 237-240, vol. 35.
Bender et al., *Multiple Imprinting in UV Based Nanoimprint Lithography: Related Material Issues*, Microelectronic Engineering, 61-62 (2002), pp. 407-413.
Chou, *Ultrafast and Direct Imprint of Nanostructures in Silicon*, Nature, Col. 417, (Jun. 2002), pp. 835-837.
Choi et al. "High Precision Orientation Alignment and Gap Control Stages for Imprint Lithography Processes", U.S. Appl. No. 09/698,317, filed with USPTO on Oct. 27, 2000.
Willson et al., "Method and System for Fabricating Nanoscale Patterns in Light Curable Compositions using an Electric Field", U.S. Appl. No. 60/291,664, filed with USPTO on May 16, 2001.
Sreenivasan et al., "High-Resolution Overlay Alignment Methods and Systems for Imprint Lithography", U.S. Appl. No. 09/907,512, filed with USPTO on Jul. 16, 2001.
Choi et al., "Method and System of Automatic Fluid Dispensing for Imprint Lithography Processes", U.S. Appl. No. 09/908,455, filed with USPTO on Jul. 17, 2001.
Willson et al., "Step and Flash Imprint Lithography", U.S. Appl. No. 09/908,765, filed with USPTO on Jul. 19, 2001.
Choi et al., "Methods for High-Precision Gap and Orientation Sensing Between a Transparent Template and Substrate for Imprint Lithography", U.S. Appl. No. 09/920,341, filed with USPTO on Aug. 1, 2001.
Choi et al., "Flexure Based Macro Motion Translation Stage", U.S. Appl. No. 09/934,248, filed with USPTO on Aug. 21, 2001.
Bailey et al., "Template for Room Temperature, Low Pressure Micro- and Nano-Imprint Lithography", U.S. Appl. No. 09/976,681, filed with USPTO on Oct. 21, 2001.
Voisin, "Methods of Manufacturing a Lithography Template", U.S. Appl. No. 10/136,188, filed with USPTO on May 1, 2002.
Watts et al. "System and Method for Dispensing Liquids", U.S. Appl. No. 10/191,749, filed with USPTO on Jul. 9, 2002.
Sreenivasan et al., "Step and Repeat Imprint Lithography Processes", U.S. Appl. No. 10/194,991, filed with USPTO on Jul. 11, 2002.
Sreenivasan et al., "Step and Repeat Imprint Lithography Systems", U.S. Appl. No. 10/194,414, filed with USPTO on Jul. 11, 2002.
Sreenivasan et al., "Method and System for Imprint Lithography using an Electric Field", U.S. Appl. No. 10/194,410, filed with USPTO on Jul. 11, 2002.
Gokan et al., "Dry Etch Resistance of Organic Materials," J. Electrochem. Soc. 130:1, 143-146 (Jan. 1983).
Lin, "Multi-Layer Resist Systems", Introduction of Microlithography, American Chemical Society, 1983, pp. 287-350, IBM T.J. Watson Research Center, Yorktown Heights, New York 10598.
Cowie, "Polymers: Chemistry and Physics of Modern Materials," 1991, pp. 408-409, 2nd Ed, Chapman and Hall, a division of Routledge, Chapman and Hall, Inc., 29 West 35th Street, NY, NY 10001-2291.
Krug et al., "Fine Patterning of Thin Sol-Gel Films," Journal of Non-Crystalline Solids, 1992, pp. 447-450. vol. 147 & 148.
Kotachi et al., "Si-Containing Positive Resist for ArF Excimer Laser Lithography," J. PhotopolymerSci. Tevhnol. 8(4) 615-622, 1995.
Krauss et al., "Fabrication of Nanodevices Using Sub-25nm Imprint Lithography," Appl. Phys. Lett 67(21), 3114-3116, 1995.

Chou et al., "Imprint of Sub-25 nm Vias and Trenches in Polymers," Applied Physics Letters, Nov. 20, 1995, pp. 3114-3116, vol. 67(21).

Chou et al., "Imprint Lithography with 25-Nanometer Resolution," Science, Apr. 5, 1996, pp. 85-87, vol. 272.

Scheer et al., "Problems of the Nanoimprinting Technique for Nanometer Scale Pattern Definition," Journal of Vaccum Science and Technology, Nov./Dec. 1998, pp. 3917-3921, vol. B 16(6).

Xia et al., "Soft Lithography," Annu. Rev. Mater. Sci., 1998, pp. 153-184, vol. 28.

Xia et al., "Soft Lithography," Agnew. Chem. Int. Ed., 1998, pp. 550-575, vol. 37.

Colburn. et al., "Step and Flash Imprint Lithography: A New Approach to High-Resolution Patterning", Proc. of SPIE, 1999, pp. 379-389, vol. 3676.

Chou et al., "Lithographically-Induced Self Assembly of Periodic Polymer Micropillar Arrays," Journal of Vacuum Science and Technology, Nov./Dec. 1999, pp. 3197-3202, vol. B 17(6).

Choi et al., "Design of Orientation Stages for Step and Flash Imprint Lithography," Precision Engineering, Journal of the International Societies for Precision Engineering and Nanotechnology, 2001, pp. 192-199, vol. 25.

Chou, "Nanoimprint Lithography and Lithographically Induced Self-Assembly," MRS Bulletin, Jul. 2001, pp. 512-517.

Nguyen, A. Q., "Asymmetric Fluid-Structure Dynamics in Nanoscale Imprint Lithography," University of Texas at Austin, Aug. 2001.

Willson et al., "Method and System for Fabricating Nanoscale Patterns in Light Curable Compositions Using an Electric Field," U.S. Appl. No. 09/905,718, filed with USPTO on May 16, 2002.

Watts et al., "Low Viscosity.High Resolution Patterning Material," U.S. Appl. No. 10/178,947, filed with USPTO on Jun. 24, 2002.

Nguyen et al., "Method To Reduce Adhesion Between A Polymerizable Layer And A Substrate Employing A Fluorine Containing Layer," U.S. Appl. No. 10/375,817, filed with USPTO on Feb. 27, 2003.

Nguyen et al., "Composition And Method To Form A Release Layer," U.S. Appl. No. 10/375,832, filed with USPTO Feb. 27, 2003.

Nguyen et al., "Low Surface Energy Templates," U.S. Appl. No. 10/687,519, filed with USPTO on Oct. 16, 2003.

Abstract of Japanese Patent 02-24848, Jan. 26, 1990.

Abstract of Japanese Patent 02-92603, Aug. 12, 2004.

Abstract of Japanese Patent 55-88332, Apr. 14, 2004.

Abstract of Japanese Patent 57-7931, Apr. 14, 2004.

Abstract of Japanese Patent 63-138730, Apr. 14, 2004.

Ananthasuresh et al., "Strategies for Systematic Synthesis of Compliant Mems.", DSC-vol. 55-2, Dynamic Systems and Control: vol. 2, pp. 677-686, Nov. 1, 1994.

Arai et al., "Calibration and Basic Motion of Micro Hand Module.", IEEE, Jan. 1, 1993, pp. 1660-1665.

Arai et al., "Development of a New Parallel Manipulator with Fixed Linear Actuator.", In Proceedings of Japan/USA Symposium on Flexible Automation, Jan. 1, 1996, vol. 1, ASME, New York, pp. 145-149.

Bailey et al., "Imprint Lithography Templates having Alignment Marks," U.S. Appl. No. 10/666,527, filed with USPTO Sep. 18, 2003.

Cherala et al., "Applying Imprinting Material to Substrates Employing Electromagnetic Fields," U.S. Appl. No. 10/687,562, filed with USPTO Oct. 16, 2003.

Sreenivasan et al., "A Conforming Template for Patterning Liquids Disposed on Substrates." U.S. Appl. No. 10/614,716, filed with USPTO on Jul. 7, 2003.

CIBA Specialty Chemicals, "What is UV Curing?", www.cibasc.com/image.asp?id=4040.

Feldman et al., "Wafer Chuck Magnification Correction in X-Ray Lithography.", J. Vac. Sci. Technol. B 16(6), Nov. 1, 1998, pp. 3476-3479.

Feynman, "There's Plenty of Room at the Bottom.", International Appl. No. PCT/US2002/015551.

Goldfarb et al., "A Well-Behaved Revolute Flexure Joint for Compliant Mechanism Design."

Goldfarb et al., "Compliant Micromanipulator Design for Scaled Bilateral Telemanipulation of Small-Scale Environments.", ASME International Mechanical Engineering Conference and Exposition, Nov. 1, 1998, DSC-vol. 64, pp. 213-218.

Hashimoto et al., "Design and Characteristics of a Parallel Link Complaint Wrist." IEEE, May 1, 1994, Department of Mechanical Engineering, Kagoshiam University, pp. 2457-2462.

Heidari, "Nanoimprint Lithography at the 6 in. Wafer Scale.", J. Vac. Sci. Technol. B 18 (6), Nov. 1, 2000, pp. 3557-3560.

HEXAPODS, "G1000-PS Power Series", www.hexapods.com.

*Hexel Coporation, "Tornado 2000 System Specifications.",* www.hexel.com, Nov. 12, 1999.

Hirai et al., "Mold Surface Treatment for Imprint Lithography.", Journal of Photopolymer Science and Technology, Aug. 1, 2001, vol. 14, No. 3, pp. 457-462.

Hogan et al., "Impedance Control: An Approach to Manipulation: Part 1- Theory.", Journal of Dynamic Systems, Measurement, and Control, Mar. 1, 1985, vol. 107, pp. 1-7.

Hollis et al., "A Six-Degree-of-Freedom Magnetically Levitated Variable Compliance Fine-Motion Wrist: Design, Modeling, and Control.", IEEE Transactions on Robotics and Automation, Jun. 1, 1991, vol. 7., No. 3, pp. 320-332.

Howell et al., "A Loop-Closure Theory for the Analysis and Synthesis of Compliant Mechanisms.", Journal of Mechanical Design, Mar. 1, 1996, vol. 188, pp. 121-125.

Hu et al., "Fluorescence Probe Techniques (FPT) for Measuring the Relative Efficiencies of Free-Radical Photoinitiators.", Macromolecules, May 29, 1998, 31, pp. 4107-4113.

International Application No. PCT/US2002/015551, Communication Relating to the Results of the Partial International Search.

International Search Report for PCT/US 00/30041, Oct. 18, 2001.

International Search Report for PCT/US 01/26049, Feb. 19, 2002.

Johnson et al., "Advances in Step and Flash Imprint Lithography.", SPIE Microlithography Conference, Feb. 23, 2003.

Kanetomo et al., "Robot for Use in Ultrahigh Vacuum.", Solid State Technology, Aug. 1, 1997, pp. 63-72.

Kim et al., "Surface Energy and Polarity of Treated Indium-Tin-Oxide Anodes for Polymer Light-Emittng Diodes Studied by Contact Angle Measurements." Journal of Applied Physics 1999, pp. 2774-2778, vol. 86, No. 5.

Kim et al., "High-precision Magnetic Levitation Stage for Photolithography.", Precision Engineering, Apr. 1, 1998, vol. 22., No. 2, pp. 66-77.

Koseki, "Design and Accuracy Evaluation of High-Speed and High Precision Parallel Mechanism.", Proc. Of IEEE, Jan. 1, 1998, Intl. Conf. on Robotics & Automation, pp. 1340-1345.

Lee et al., "An Ultraprecision Stage for Alignment of Wafers in Advanced Microlithography.", Precision Engineering, Sep. 1, 1997, pp. 113-122.

Lee et al., "Ultra Precision Positioning System for Servo Motor-piezo Actuator Using the Dual Servo Loop and Digital filter Implementation.", American Society for Precision Engineering, Jan. 1, 1998, pp. 287-290.

Lucas Aerospace, Free-Flex® Pivot Catalog, Jan. 1, 1999.

Mansky et al., "Large-Area Domain Alignment in Block Copolymer Thin Films Using Electric Fields.", Macromolecules, Jun. 9, 1998, vol. 31, No. 13, pp. 4399-4401.

McMackin et al., "A Method of Creating a Turbulent Flow of Fluid between a Mold and a Substrate," U.S. Appl. No. 10/898,034, filed with USPTO Jul. 23, 2004.

McMackin et al., *"A System of Creating a Turbulent Flow of Fluid between a Mold and a Substrate,"* U.S. Appl. No. 10/898,037, filed with USPTO Jul. 23, 2004.

McMackin et al., Single Phase Fluid Imprint Lithography Method, U.S. Appl. No. 10/677,639, filed with USPTO Oct. 16, 2003.

Merlet, "Parallel Manipulators: State of the Art and Perspectives.", Advanced Robotics, Jan. 1, 1994, vol. 8, pp. 589-596.

Mirkin et al., "Emerging Methods for Micro-and-Nanofabrication.", MRS Bulletin, Jul. 1, 2001, pp. 506-509.

Mittal, "Precision Motion Control of a Magnetic Suspension Actuator Using a Robust Nonlinear Compensation Scheme.", IEE/ASME Transactions on Mechatronics., Dec. 1, 1997, vol. 2., No. 4, pp. 268-280.

NERAC.COM Retro Search, "Multi-Layer Resists.", Sep. 2, 2004.
NERAC.COM Retro Search, "Reduction of Dimension of Contact Holes.", Aug. 31, 2004.
NERAC.COM Retro Search, "Trim Etching of Features Formed on an Organic Layer.", Sep. 2, 2004.
Ohya et al., "Development of 3-DOF Finger Module for Micro Manipulation.", Proc. of IEEE, Mar. 1, 1999, Intl. Conf. on Intelligent Robots and Systems, pp. 894-899.
Otto et al., "Step and Repeat UV-Nanoimprint Lithography: Material Issues.", NNT02 San Francisco, Dec. 11, 2002.
Papirer et al., "Abstract of The Grafting of Perfluorinated Silanes onto the Surface of Silica: Characterization by Inverse Gas Chromatography.", Journal of Colloid and Interface Science 159, Aug. 1, 1993, pp. 238-242.
Papirer et al., "The Grafting of Perfluorinated Silanes onto the Surface of Silica: Characterization by Inverse Gas Chromatography.", Journal of Colloid and Interface Science 159, Aug. 1, 1993, pp. 238-242.
Paros et al., "How to design Flexure Hinges.", Machine Design, Nov. 25, 1965, pp. 151-156.
Peng et al., "Compliant Motion Control of Kinematically Redundant Manipulators.", IEEE Transactions on Robotics and Automation, Dec. 1, 1993, vol. 9, No. 6, pp. 831-837.
Pernette et al., "Design of Parallel Robots in Microbotics.", Robotica, Jan. 1, 1997, vol. 15, pp. 417-420.
*Physik Instruments, PI Online-Catalog*, 1999, from www.physikinstruments.com.
Physik Instruments, Product Catalog for Micropositioning, 1997.
Raibert et al., *"Hybrid Position/Force Control of Manipulators."*, Journal of Dynamic Systems, Measurement, and Control, Jun. 1, 1981, vol. 102, pp. 126-133.
Rong et al., "Design and Analysis of Flexure-Hinge Mechanism Used in Micro-Positioning Stages.", ASME, Jan. 1, 1994, vol. 2, pp. 979-985.
Rong et al., "Dynamics of Parallel Mechanism with Direct Compliance Control.", IEEE, Jan. 1, 1997, pp. 1753-1758.
Roos et al., "Nanoimprint Lithography with a Commercial 4 Inch Bond System for Hot Embossing.", Proceedings of SPIE, Oct. 1, 2001, vol. 4343, pp. 427-435.
Ruchhoeft et al., "Patterning Curved Surfaces: Template Generation by Ion Beam Proximity Lithography and Relief Transfer by Step and Flash Imprint Lithography.", Journal of Vacuum Science and Technology, pp. 1-17.
Slocum, "Precision Machine Design: Macromachine Design Philosophy and Its Applicability to the Design of Micromachines.", Micro Electro Mechanical Systems, Feb. 4, 1992.
Sowah, Diamond Used to Break the Mould [online], Sep. 18, 2002, [Retrieved on Sep. 2, 2003.] Retrieved from the Internet: <URL: http: Http://eetuk.com/showArticle,jhtml?articleID=19203691>.
Sreenivasan et al., "An Imprint Lithography System to Produce a Light to Impinge upon and Polymerize a Liquid in Superimposition with Template Overlay Marks," U.S. Appl. No. 10/864,214, filed with USPTO Jun. 9, 2004.
Stewart, "A Platform With Six Degrees of Freedom.", Proc Instn Mech Engrs, May 28, 1965, vol. 180, Pt1, No. 15, pp. 371-378.
Stix, "Getting More from Moores", Scientific American.
Sung et al., "Abstract of Micro/nano-tribological Characteristics of Self-Assembled Monolayer and its Application in Nano-Structure Fabrication", Elsevier Science B.V., Jul. 1, 2003, vol. 255, No. 7.
Sung et al., "Micro/nano-tribological Characteristics of Self-Assembled Monolayer and its Application in Nano-Structure Fabrication.", Elsevier Science B.V., Jul. 1, 2003, vol. 255, No. 7, pp. 808-818.
Tajbakhsh et al., "Three-Degree-of-Freedom Optic Mount for Extreme Ultraviolet.", American Society for Precision Engineering, Jan. 1, 1998, pp. 359-362.
Tanikawa et al., "Development of Small-sized 3 DOF Finger Module in Micro Hand for Micro Manipulation.", Proc. of IEEE, Mar. 1, 1999, Intl. conf. on Intelligent Robots and Systems, pp. 876-881.
Tomita et al., "A 6-axes Motion Control Method for Parallel-Linkage-Type Fine Motion Stage.", JSPE-58-04, pp. 118-124.
Translation of Japanese Patent 02-24848, Jan. 26, 1990.
Translation of Japanese Patent 02-92603, Apr. 3, 1990.
Trilogy Systems, "Linear Motors 310.", wwww.trilogysystems.com, Jan. 1, 2001.
U.S. Appl. No. 10/375,817, filed Feb. 27, 2003, Nguyen et al., "Method to Reduce Adhesion between a Polymerizable Layer and a Substrate Employing a Flourine-Containing Layer."
U.S. Appl. No. 10/463,396, filed Jun. 17, 2003, Choi et al., "Method to Reduce Adhesion Between a Conformable Region and a Pattern of a Mold."
U.S. Appl. No. 10/735,110, filed Dec. 12, 2003, Nimmakayala et al., "Magnification Correction Employing Out-of-Plane Distortion of a Substrate."
U.S. Appl. No. 10/785,248, filed Feb. 24, 2004, Choi et al., "A Method to Control the Relative Position Between a Body and a Surface."
U.S. Appl. No. 10/788,700, filed Feb. 27, 2004, Sreenivasan et al., "Full-Wafer or Large Area Imprinting with Multiple Separated Sub-Fields for High Throughput Lithography."
U.S. Appl. No. 10/806,956, filed Mar. 23, 2003, Choi et al., "An Apparatus to Control Displacement of a Body Spaced-Apart from a Surface."
U.S. Appl. No. 10/194,991, filed Jul. 11, 2002, Sreenivasan et al., "Step and Repeat Lithography Processes."
U.S. Appl. No. 10/687,519, filed Oct. 16, 2003, Nguyen et al., "Low Surfaced Energy Template."
*Vanderbilt University Office of Transfer Technology; VU9730 Specifications for Improved Flexure Device*; 2001, 25, 192-199.
Wang et al., "Passive Compliance versus Active Compliance in Robot-Based Automated Assembly Systems.", Industrial Robot, Jan. 1, 1998, vol. 25, No. 1, pp. 48-57.
Williams et al., "Six Degree of Freedom Mag-Lev Stage Development.", SPIE, Jan. 1, 1997, vol. 3051, pp. 856-867.
Wu, "Large Area High Density Quantized Magnetic Disks Fabricated Using Nanoimprint Lithography.", J. Vac. Sci. Technol., Nov. 1, 1998, B 16(6), pp. 3825-3829.
Xu et al., "Materials for Imprint Lithography," U.S. Appl. No. 10/784,911, filed with USPTO Feb. 23, 2004.
Xu et al., Methods for Fabricating Patterned Features Utilizing Imprint Lithography,: U.S. Appl. No. 10/694,284, filed with USPTO Oct. 27, 2003.
Parikh et al.,"An Intrinsic Relationship between Molecular Structure in Self-Assembled n-Alkysiloxane Monolayers and Deposition Temperature," Journal of Phys. Chem., pp. 7577-7590, 1994.
Sagiv, J., "Organized Monolayers by Adsorption. 1. Formation and Structure of Oleophobic Mixed Monolayes and Solid Surfaces," Journal of the American Chemical Society, vol. 102, pp. 92-98, Jan. 2, 1980.
Srinivasan et al.,"Alkyltrichlorosilane-Based Self-Assembled Monolayer Films for Stiction Reduction in Silicon Micromachines," Journal of Microelectromechanical Systems, vol. 7, No. 2, p. 252-260, Jun. 1, 1998.
Blomquist et al., Fluorinated Acrylates in making Low-Loss, Low-Birefringence, and Single-Mode Optical Waveguides with Exceptional Thermo-Optic Properties, SPIE Conference on Linear Optical Properties of Waveguides and Fibers, vol. 3799, pp. 266-279 Jul. 1, 1999.
Bender et al., Fabrication of Nanostructures using a UV-based Imprint Technique, Microelectronic Engineering 53, pp. 233-236 Jan. 1, 2000.
Eldada et al., Robust Photopolymers for MCM, Board, and Backplane Optical Interconnects, SPIE vol. 3288, pp. 175-191 Jan. 1, 1998.
Eldada et al., Affordable WDM Components: The Polymer Solution, SPIE vol. 3234, pp. 161-174 Jan. 1, 1998.
Eldada et al., Advanced Polymer Systems for Optoelectronic Integrated Circuit Applications, SPIE vol. 3006, pp. 344-361 Jan. 1, 1997.
Hirai et al., Abstract of Mold Surface Treatment for Imprint Lithography, Journal of Photopolymer Science and Technology, pp. 457-462, vol. 14, No. 3 Aug. 1, 2001.
Roos et al., Abstract of Nanoimprint Lithography with a Commercial 4 Inch Bond System for Hot Embossing, Proceedings of SPIE vol. 4343, pp. 427-435 Oct. 1, 2001.

Sol-Gel Technology, www.chemat.com/html/solgel.html Jan. 14, 2004.

Sol-Gel Chemistry, www.prsc.usm.edu/mauritz/solgel.html Feb. 2, 2004.

Hakovirta et al., Optical Properties of Fluorinated Diamond-Like Carbon Films Produced by Pulsed Glow Discharge Plasma Immersion Ion Processing, Journal of Applied Physics 88(3); pp. 1456-1459 Aug. 1, 2000.

Yu et al., Properties of Fluorinated Amorphous Diamond Like Carbon Films by PECVD, Applied Surface Science 219 (3-4); pp. 228-237 Dec. 1, 2003.

Compon et al., Electroanalysis at Diamond-Like and Doped-Diamond Electrodes, Electroanalysis 15(17); pp. 1349-1363 Sep. 1, 2003.

Mansano et al., Protective Carbon Layer for Chemical Corrosion of Stainless Steel, Diamond and Related Materials 12 (3-7); pp. 749-752 Mar. 1, 2003.

Butter et al., Production and Wetting Properties of Fluorinated Diamond-Like Carbon Coatings, Thin Solid Films, 311(1-2); pp. 107-113 Dec. 31, 1997.

Hakovirta et al., Heat Resistance of Fluorinated Diamond-Like Carbon Films, Diamond and Related Materiasl 10(8); pp. 1486-1490 Aug. 1, 2001.

Zhu et al., The Improvement of the Oxidation Resistance of TiAl Alloys by Fluorine Plasma-Based Ion Implantation, Surface and Coatings Technology 158; pp. 502-507 Sep. 1, 2002.

Yao et al., Structural, Mechanical and Hydrophobic Properties of Fluorine-Doped Diamond-Like Carbon Films Synthesized by Plasma Immersion Ion Implantation and Deposition (PIII-D), Applied Surface Science 230; pp. 172-178 Apr. 17, 2004.

U.S. Appl. No. 10/858,566, naming Inventors Truskett et al., entitled A Method for Dispensing a Fluid on a Substrate, filed Jun. 1, 2004.

U.S. Appl. No. 10/978,285, naming Inventors Willson et al., entitled Step and Flash Imprint Lithography, filed Oct. 29, 2004.

U.S. Appl. No. 11/005,742, naming Inventors McMackin et al., entitled Method for Fast Filling of Templates for Imprint Lithography using on Template Dispense, filed Dec. 7, 2004.

U.S. Appl. No. 11/006,363, naming Inventors McMackin et al., entitled System for Controlling a Volume of Material Remaining on a Mold Employed in Fast Filling Imprint Lithography Processes, filed Dec. 7, 2004.

U.S. Appl. No. 11/068,397, naming Inventors Xu et al., entitled Method of Providing Desirable Wetting and Release Characteristics between a Mold and a Polyerizable Composition, filed Feb. 28, 2005.

Data Sheet for MAK (Methyl n-Amyl Ketone), www.sp-chem.com/fine_e Jan. 1, 2003.

Data Sheet for gamma-Glycidoxypropyltrimethoxysilane, www.powerchemical.net/3100.htm Dec. 5, 2003.

Silicon or Silica, www.mii.org/Minerals/photosil Mar. 31, 2005.

Electronic Devices and Circuits, people.deas.harvard.edu/~jones/es154/lectures/lecture_2/materials/materials.html Mar. 31, 2005.

Data Sheet for Cymel 303ULF, www.cytec.com.

Data Sheet for Cycat 4040, www.cytec.com.

International Chemical Safety Card for p-Toluenseulfonic Acid, www.itcilo.it/english/actrav/telearn/osh/ic/104154.htm Dec. 5, 2003.

Data Sheet for p-Toluenesulfonic Acid, NIOSH Manual of Analytical Methods (NMAM), Fourth Edition.

Data Sheet for Dow Corning Z-6018.

Data Sheet for Methyl Amyl Ketone, www.arb.ca.gov/db/solvents/solvent_pages/Ketones-HTML/methyl_amyl.htm Mar. 31, 2005.

Golden et al., Designing Porous Low-k Dielectrics, www.reed-electronics.com/semiconductor/index.asp?layout=articlePrint&articleID=CA82824 Apr. 6, 2005.

Padovani et al., Chemically Bonded Porogens in Methylsilsesquioxane: I. Structure and Bonding, Journal of the Electrochemical Society, 149 (12) F161-F170 Oct. 16, 2002.

Wolf et al., Silicon Processing for the VLSI Era, vol. 1—Process Technology, pp. 407-413 Jan. 1, 1986.

U.S. Appl. No. 11/101,139, naming Inventors Shackleton et al., entitled System for Controlling a Volume of Material on a Mold, filed Apr. 7, 2005.

U.S. Appl. No. 11/101,140, naming Inventors McMackin, entitled Method for Fast Filling of Templates for Imprint Lithography Using on Template Dispense, filed Apr. 7, 2005.

NERAC.COM Retro Search, Fluid Dispensing, May 4, 2005.

Taniguchi et al., Diamond Nanoimprint Lithography, Nanotechnology, 2002, vol. 13, No. 5, pp. 592-596(5) Jan. 1, 2002.

Kiyohara et al., Abstract of Plasma Etching of CVD Diamond Films using an ECR-type Oxygen Source, http://www.iop.org/EJ/abstract/0957-4484/10/4/304 Sep. 26, 2003.

U.S. Appl. No. 11/126,946, naming Inventors Choi et al., entitled Formation of Discontinuous Films During an Imprint Lithography Process, filed May 11, 2005.

U.S. Appl. No. 11/127,041, naming Inventors Sreenivasan et al., entitled Step and Repeat Imprint Lithography Processes, filed May 11, 2005.

U.S. Appl. No. 11/127,060, naming Inventors Sreenivasan et al., entitled Step and Repeat Imprint Lithography Systems, filed May 11, 2005.

U.S. Appl. No. 11/143,092, naming Inventors Lad et al., entitled Fluid Dispensing and Drop-on-Demand Dispensing for Nano-Scale Manufacturing, filed Jun. 2, 2005.

Wolf et al., Silicon Processing for the VLSI Era, vol. 1—Process Technology, pp. 541, 542, 544, 564, 565 Jan. 1, 1986.

Novec Fluorosurfactant FC-4432, http://multimedia.mmm.com/mws/mediawebserver.dyn?333333SQa783cMj3wMj333wyXuFiiiiH-8/4/2005.

Abstract of Japanese Patent 61-040845, Feb. 27, 1986.

Abstract of Japanese Patent 02-248480, Oct. 4, 1990.

Abstract of Japanese Patent 3-090345, Apr. 16, 1991.

Abstract of Japanese Patent 09-278490, Oct. 28, 1997.

U.S. Appl. No. 11/187,406, naming Inventors Xu, entitled Composition for adhering materials together, filed Jul. 22, 2005.

U.S. Appl. No. 11/187,407, naming Inventors Xu, entitled Method for adhering materials together, filed Jul. 22, 2005.

Xu et al., Development of Imprint Materials for the Step and Flash Imprint Lithography Process, SPIE Microlithography Conference Feb. 1, 2004.

Nordquist et al., Image Placement Issues for ITO-based Step and Flash Imprint Lithography Templates, J. Vac. Sci. Technol. B, pp. 695-701 Mar. 1, 2004.

Resnick et al., Release Layers for Contact and Imprint Lithography, Semiconductor International, pp. 71-80 Jun. 1, 2002.

Colburn et al., Step and Flash Imprint Lithography for sub-100 nm Patterning, Proceedings of SPIE vol. 3997, pp. 453-457, Jan. 1, 2000.

Colburn et al., Development and Advantages of Step-and-Flash Lithography, Solid State Technology, Jul. 1, 2001.

Colburn et al., Characterization and Modeling of Volumetric and Mechanical Properties for Step and Flash Imprint Lithography Photopolymers, Journal of Vacuum Science Technology, vol. b. 19(6), Nov. 1, 2001.

Bailey et al., Step and Flash Imprint Lithography: Defect Analysis, Journal of Vacuum Science, B 19(6), pp. 2806-2810, Nov. 1, 2001.

Bailey et al., Step and Flash Imprint Lithography: Template Surface Treatment and Defect Analysis, Journal of Vacuum Science, B 18(6), pp. 3572-3577, Nov. 1, 2000.

Schneider et al., Stripes of Partially Fluorinated Alkyl Chains: Dipolar Langmuir Monolayers, date unknown.

U.S. Appl. No. 10/763,885, filed Jan. 23, 2004, Xu et al.

U.S. Appl. No. 10/789,319, filed Feb. 27, 2004, Xu et al.

U.S. Appl. No. 10/948,511, filed Sep. 23, 2004, Xu et al.

U.S. Appl. No. 10/967,740, filed Oct. 18, 2004, Xu et al.

U.S. Appl. No. 10/919,062, filed Aug. 16, 2004, Xu et al.

U.S. Appl. No. 10/919,224, filed Aug. 16, 2004, Xu et al.

U.S. Appl. No. 11/026,821, filed Dec. 30, 2004, Willson et al.

U.S. Appl. No. 11/062,420, filed Feb. 22, 2005, Willson et al.

U.S. Appl. No. 11/068,174, Feb. 28, 2005, Xu et al.

U.S. Appl. No. 11/068,171, filed Feb. 28, 2005, Xu et al.

* cited by examiner

METHOD TO REDUCE ADHESION BETWEEN A CONFORMABLE REGION AND A PATTERN OF A MOLD

BACKGROUND OF THE INVENTION

The field of invention relates generally to micro-fabrication of structures. More particularly, the present invention is directed to patterning substrates in furtherance of the formation of structures.

Micro-fabrication involves the fabrication of very small structures, e.g., having features on the order of micro-meters or smaller. One area in which micro-fabrication has had a sizeable impact is in the processing of integrated circuits. As the semiconductor processing industry continues to strive for larger production yields while increasing the circuits per unit area formed on a substrate, micro-fabrication becomes increasingly important. Micro-fabrication provides greater process control while allowing a reduction in the minimum feature dimension of the structures formed. Other areas of development in which micro-fabrication has been employed include biotechnology, optical technology, mechanical systems and the like.

An exemplary micro-fabrication technique is shown in U.S. Pat. No. 6,334,960 to Willson et al. Willson et al. disclose a method of forming a relief image in a structure. The method includes providing a substrate having a transfer layer. The transfer layer is covered with a polymerizable fluid composition. A mold makes mechanical contact with the polymerizable fluid. The mold includes a relief structure, and the polymerizable fluid composition fills the relief structure. The polymerizable fluid composition is then subjected to conditions to solidify and polymerize the same, forming a solidified polymeric material on the transfer layer that contains a relief structure complimentary to that of the mold. The mold is then separated from the solid polymeric material such that a replica of the relief structure in the mold is formed in the solidified polymeric material. The transfer layer and the solidified polymeric material are subjected to an environment to selectively etch the transfer layer relative to the solidified polymeric material such that a relief image is formed in the transfer layer.

An important characteristic with accurately forming the pattern in the polymeric material is to reduce, if not prevent, adhesion of the polymeric material, and/or, transfer layer, to the mold. These are referred to as release characteristics. In this manner, the pattern recorded in the polymeric material and/or transfer layer is not distorted during separation of the mold therefrom. To improve the release characteristics, Willson et al. form a release layer on the surface of the mold. The release layer is typically hydrophobic and/or has low surface energy. The release layer adheres to the mold and to either the transfer layer or the polymeric material. Providing the transfer layer with improved release characteristics minimizes distortions in the pattern recorded into the polymeric material and/or the transfer layer that are attributable to mold separation. This type of release layer is referred to, for purposes of the present discussion, as an a priori release layer, i.e., a release layer that is solidified to the mold.

Another prior art attempt to improve release characteristics is described by Bender et al. in *Multiple Imprinting in UV-based Nanoimprint Lithography: Related Material Issues*, Microeletronic Engineering 61–62 (2002), pp. 407–413. Specifically, Bender et al. employ a mold having an a priori release layer in conjunction with a fluorine-treated UV curable material. To that end, a UV curable layer is applied to a substrate by spin-coating a 200 CPS UV curable fluid to form a UV curable layer. The UV curable layer is enriched with fluorine groups to improve the release characteristics.

A priori release layers, however, typically have a limited operational life. As a result, a single mold may be coated multiple times with an a priori release layer. This can result in several hours of down-time for a given mold, reducing throughput. Additionally, the molecular structure of the a priori release layer may limit the minimization of the minimum feature dimension that is printed.

There is a need, therefore, to improve the release characteristics of a mold employed in imprint lithography processes.

SUMMARY OF THE INVENTION

The present invention provides a method to reduce adhesion between a substrate and a pattern of a mold. The method features forming a conformable material on the substrate and contacting the conformable material with the surface. A conditioned layer is formed from the conformable material. The conditioned layer has first and second sub-portions, with the first sub-portion being solidified and the second sub-portion having a first affinity for the surface and a second affinity for the first sub-portion. The first is greater than the second affinity. In this fashion, upon separation of the mold from the conditioned layer, a subset of the second sub-portion maintains contact with the mold, thereby reducing the probability that a pattern formed in the conditioned layer becomes compromised. These and other embodiments are described herein.

DETAILED DESCRIPTION OF THE INVENTION

Figure 1:
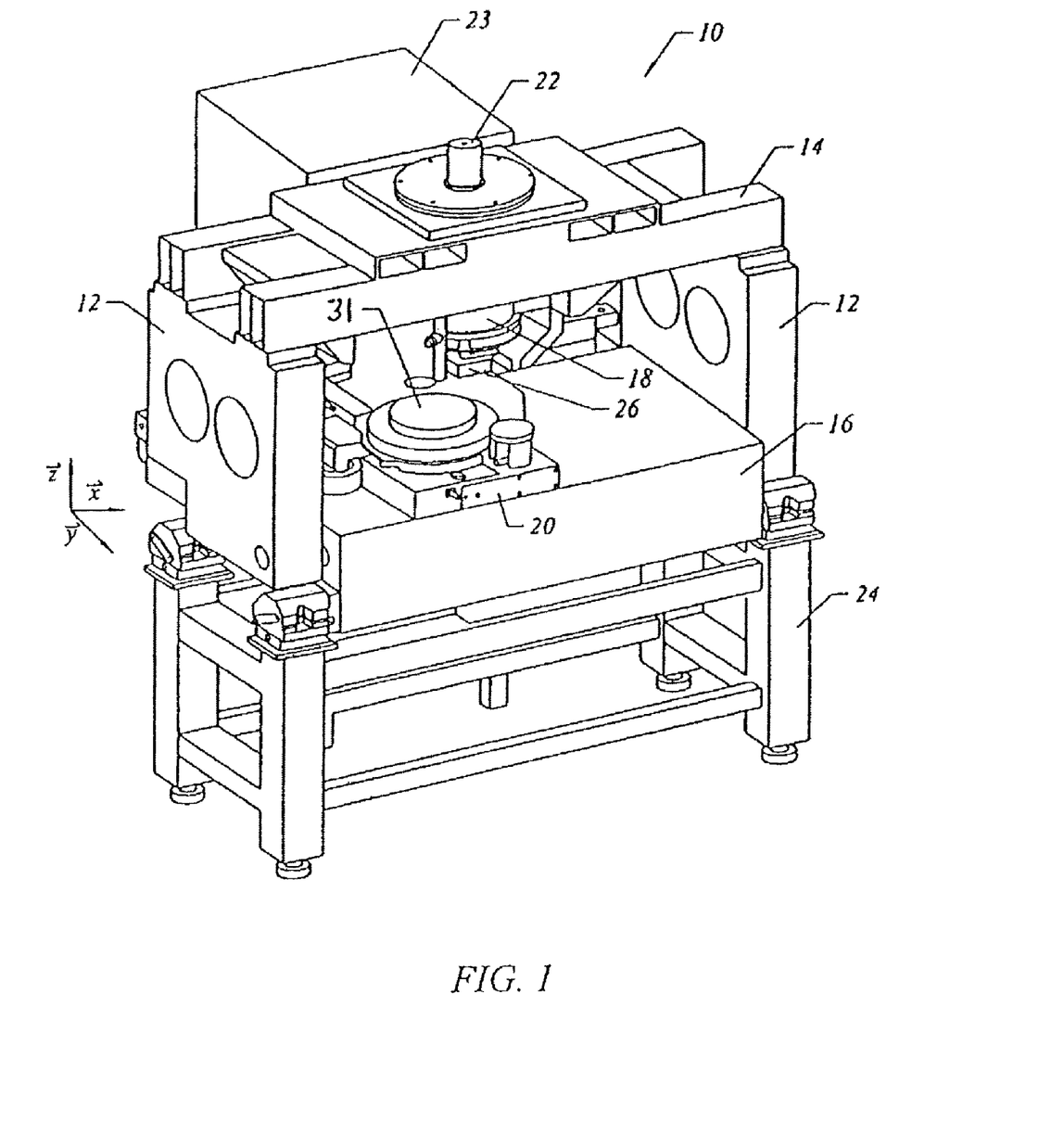
FIG. 1 is a perspective view of a lithographic system in accordance with the present invention.

FIG. 1 depicts a lithographic system 10 in accordance with one embodiment of the present invention that includes a pair of spaced-apart bridge supports 12 having a bridge 14 and a stage support 16 extending therebetween. Bridge 14 and stage support 16 are spaced-apart. Coupled to bridge 14 is an imprint head 18, which extends from bridge 14 toward stage support 16. Disposed upon stage support 16 to face imprint head 18 is a motion stage 20. Motion stage 20 is configured to move with respect to stage support 16 along X and Y axes. A radiation source 22 is coupled to system 10 to impinge actinic radiation upon motion stage 20. As shown, radiation source 22 is coupled to bridge 14 and includes a power generator 23 connected to radiation source 22.

Figure 2:
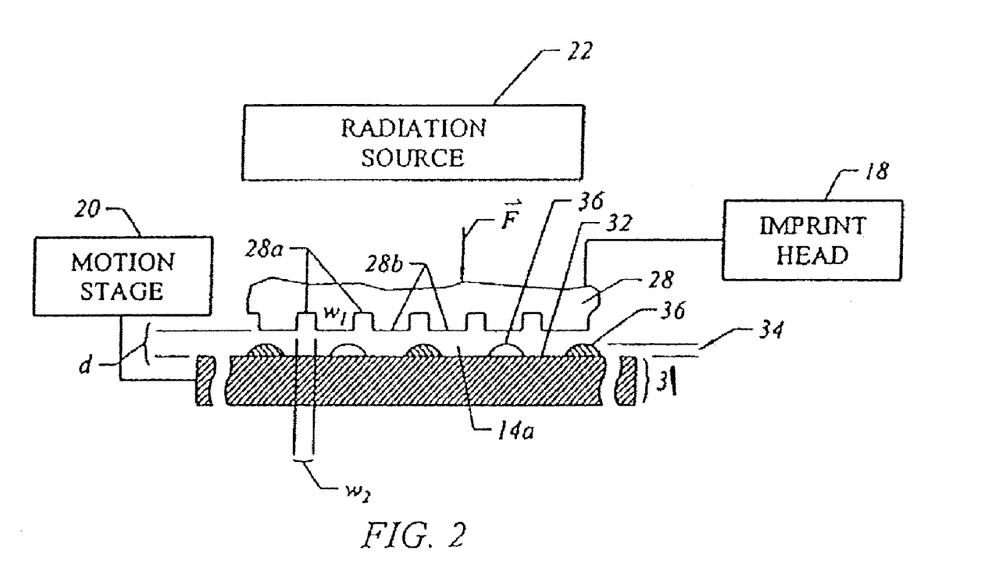
FIG. 2 is a simplified elevation view of a lithographic system shown in FIG. 1.

Referring to both FIGS. 1 and 2, connected to imprint head 18 is a template 26 having a mold 28 thereon. Mold 28 includes a plurality of features defined by a plurality of spaced-apart recessions 28a and protrusions 28b. The plurality of features defines an original pattern that is to be transferred into a substrate 31 positioned on motion stage 20. Substrate 31 may comprise of a bare wafer or a wafer with one or more layers disposed thereon. To that end, imprint head 18 is adapted to move along the Z axis and vary a distance "d" between mold 28 and substrate 31. In this manner, the features on mold 28 may be imprinted into a conformable region of substrate 31, discussed more fully below. Radiation source 22 is located so that mold 28 is positioned between radiation source 22 and substrate 31. As a result, mold 28 is fabricated from material that allows it to be substantially transparent to the radiation produced by radiation source 22.

Figure 3:
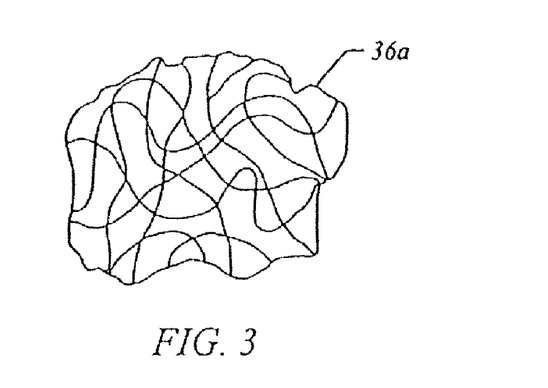
FIG. 3 is a simplified representation of material from which an imprinting layer, shown in FIG. 2, is comprised before being polymerized and cross-linked.

Referring to both FIGS. 2 and 3, a conformable region, such as an imprinting layer 34, is disposed on a portion of surface 32 that presents a substantially planar profile. It should be understood that the conformable region may be formed using any known technique to produce conformable material on such as a hot embossing process disclosed in U.S. Pat. No. 5,772,905 to Chou, which is incorporated by reference in its entirety herein, or a laser assisted direct imprinting (LADI) process of the type described by Chou et al. in *Ultrafast and Direct Imprint of Nanostructures in Silicon*, Nature, Col. 417, pp. 835–837, June 2002. In the present embodiment, however, conformable region consists of imprinting layer 34 being deposited as a plurality of spaced-apart discrete droplets 36 of material 36a on substrate 31, discussed more fully below. Imprinting layer 34 is formed from a material 36a that may be selectively polymerized and cross-linked to record the original pattern therein, defining a recorded pattern. Material 36a is shown in FIG. 4 as being cross-linked at points 36b, forming cross-linked polymer material 36c.

Figure 5:
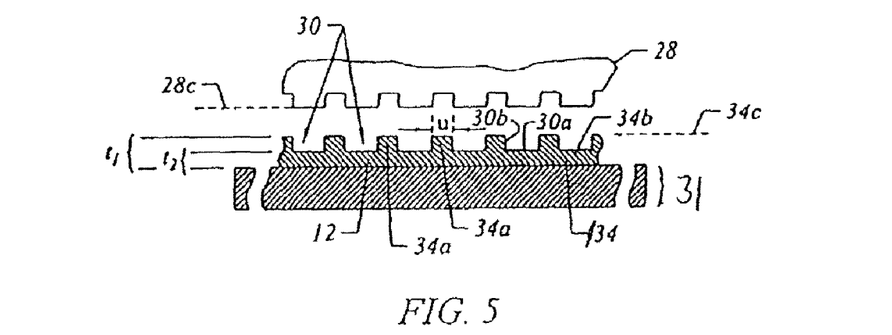
FIG. 5 is a simplified elevation view of a mold spaced-apart from the imprinting layer, shown in FIG. 1, after patterning of the imprinting layer.

Referring to FIGS. 2, 3 and 5, the pattern recorded in imprinting layer 34 is produced, in part, by mechanical contact with mold 28. To that end, imprint head 18 reduces the distance "d" to allow imprinting layer 34 to come into mechanical contact with mold 28, spreading droplets 36 so as to form imprinting layer 34 with a contiguous formation of material 36a over surface 32. In one embodiment, distance "d" is reduced to allow sub-portions 34a of imprinting layer 34 to ingress into and fill recessions 28a.

To facilitate filling of recessions 28a, material 36a is provided with the requisite properties to completely fill recessions 28a while covering surface 32 with a contiguous formation of material 36a. In the present embodiment, sub-portions 34b of imprinting layer 34 in superimposition with protrusions 28b remain after the desired, usually minimum distance "d", has been reached, leaving sub-portions 34a with a thickness $t_1$, and sub-portions 34b with a thickness, $t_2$. Thicknesses "$t_1$" and "$t_2$" may be any thickness desired, dependent upon the application. Typically, $t_1$ is selected so as to be no greater than twice the width u of sub-portions 34a, i.e., $t_1 \ge 2u$, shown more clearly in FIG. 5.

Figure 4:
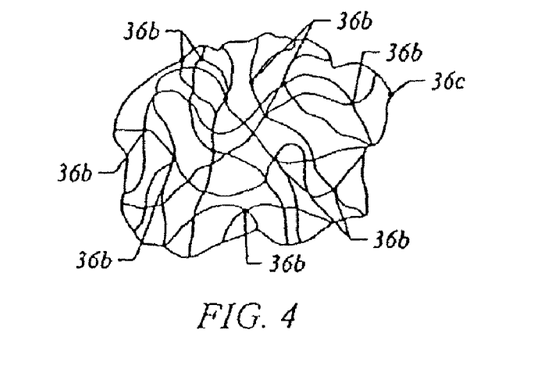
FIG. 4 is a simplified representation of cross-linked polymer material into which the material shown in FIG. 3 is transformed after being subjected to radiation.

Referring to FIGS. 2, 3 and 4, after a desired distance "d" has been reached, radiation source 22 produces actinic radiation that polymerizes and cross-links material 36a, forming polymer material 36c in which a substantial portion thereof is cross-linked. As a result, material 36a transforms to material 36c, which is a solid, forming imprinting layer 134, shown in FIG. 5. Specifically, material 36c is solidified to provide side 34c of imprinting layer 134 with a shape conforming to a shape of a surface 28c of mold 28, with imprinting layer 134 having recesses 30. After imprinting layer 134 is transformed to consist of material 36c, shown in FIG. 4, imprint head 18, shown in FIG. 2, is moved to increase distance "d" so that mold 28 and imprinting layer 134 are spaced-apart.

Referring to FIG. 5, additional processing may be employed to complete the patterning of substrate 31. For example, substrate 31 and imprinting layer 134 may be etched to transfer the pattern of imprinting layer 134 into substrate 31, providing a patterned surface (not shown). To facilitate etching, the material from which imprinting layer 134 is formed may be varied to define a relative etch rate with respect to substrate 31, as desired.

To that end, imprinting layer 134 may be provided with an etch differential with respect to photo-resist material (not shown) selectively disposed thereon. The photo-resist material (not shown) may be provided to further pattern imprinting layer 134, using known techniques. Any etch process may be employed, dependent upon the etch rate desired and the underlying constituents that form substrate 31 and imprinting layer 134. Exemplary etch processes may include plasma etching, reactive ion etching, chemical wet etching and the like.

Referring to both FIGS. 1 and 2, an exemplary radiation source 22 may produce ultraviolet radiation; however, any known radiation source may be employed. The selection of radiation employed to initiate the polymerization of the material in imprinting layer 34 is known to one skilled in the art and typically depends on the specific application which is desired. Furthermore, the plurality of features on mold 28 are shown as recessions 28a extending along a direction parallel to protrusions 28b that provide a cross-section of mold 28 with a shape of a battlement. However, recessions 28a and protrusions 28b may correspond to virtually any feature required to create an integrated circuit and may be as small as a few tenths of nanometers.

Referring to FIGS. 1, 2 and 5, the pattern produced by the present patterning technique may be transferred into substrate 31 to provide features having aspect ratios as great as 30:1. To that end, one embodiment of mold 28 has recessions 28a defining an aspect ratio in a range of 1:1 to 10:1. Specifically, protrusions 28b have a width $W_1$ in a range of about 10 nm to about 5000 μm, and recessions 28a have a width $W_2$ in a range of 10 nm to about 5000 μm. As a result, mold 28 and/or template 26, may be formed from various conventional materials, such as, but not limited to, fused-silica, quartz, silicon, organic polymers, siloxane polymers, borosilicate glass, fluorocarbon polymers, metal, hardened sapphire and the like.

Referring to FIGS. 1, 2 and 3, the characteristics of material 36a are important to efficiently pattern substrate 31 in light of the unique deposition process employed. As mentioned above, material 36a is deposited on substrate 31 as a plurality of discrete and spaced-apart droplets 36. The combined volume of droplets 36 is such that the material 36a is distributed appropriately over an area of surface 32 where imprinting layer 34 is to be formed. As a result, imprinting layer 34 is spread and patterned concurrently, with the pattern being subsequently set into imprinting layer 34 by exposure to radiation, such as ultraviolet radiation. As a result of the deposition process, it is desired that material 36a have certain characteristics to facilitate rapid and even spreading of material 36a in droplets 36 over surface 32 so that all thicknesses $t_1$ are substantially uniform and all thicknesses $t_2$ are substantially uniform. The desirable characteristics include having a low viscosity, e.g., in a range of 0.5 to 5 centepoise (csp), as well as the ability to wet surface of substrate 31 and/or mold 28 and to avoid subsequent pit or hole formation after polymerization. With these characteristics satisfied, imprinting layer 34 may be made sufficiently thin while avoiding formation of pits or holes in the thinner regions, such as sub-portions 34b, shown in FIG. 5.

The constituent components that form material 36a to provide the aforementioned characteristics may differ. This results from substrate 31 being formed from a number of different materials. As a result, the chemical composition of surface 32 varies dependent upon the material from which substrate 31 is formed. For example, substrate 31 may be formed from silicon, plastics, gallium arsenide, mercury telluride, and composites thereof. Additionally, substrate 31 may include one or more layers in sub-portion 34b, e.g., dielectric layer, metal layer, semiconductor layer, planarization layer and the like.

Referring to FIGS. 1, 2 and 3, an exemplary composition for material 36a is as follows:

COMPOSITION 1 isobornyl acrylate n-hexyl acrylate ethylene glycol diacrylate 2-hydroxy-2-methyl-1-phenyl-propan-1-one In an exemplary composition, isobornyl acrylate comprises approximately 55% of the composition, n-hexyl acrylate comprised approximately 27%, ethylene glycol diacrylate comprises approximately 15% and the initiator 2-hydroxy-2-methyl-1-phenyl-propan-1-one comprised approximately 3%. The initiator is sold under the trade name DAROCUR® 1173 by CIBA® of Tarrytown, N.Y. The above-identified composition also includes stabilizers that are well known in the chemical art to increase the operational life of the composition. To provide suitable release properties, COMPOSITION 1 is typically employed with a template treated to have a mold surface that is hydrophobic and/or low surface energy, i.e. an a priori release layer.

To improve the release properties of mold 28 and imprinting layer 34 and to ensure that imprinting layer 34 does not adhere to mold 28, the composition from which material 36a is formed may include an additive that reduces the surface tension of COMPOSITION 1. To that end, material 36a may include, as an additive, a surfactant. For purposes of this invention a surfactant is defined as any molecule, one tail of which is hydrophobic. Surfactants may be either fluorine containing, e.g., include a fluorine chain, or may not include any fluorine in the surfactant molecule structure. An exemplary surfactant is a non-ionic surfactant available under the trade name ZONYL® FSO-100 from DUPONT™ that has a general structure of $R_1R_2$ where $R_1$=F(CF$_2$CF$_2$)$_y$, with y being in a range of 1 to 7, inclusive and $R_2$=CH$_2$CH$_2$O (CH$_2$CH$_2$O)$_X$H, where X is in a range of 0 to 15, inclusive. This provides material 36a with the following composition:

COMPOSITION 2 isobornyl acrylate n-hexyl acrylate ethylene glycol diacrylate 2-hydroxy-2-methyl-1-phenyl-propan-1-one R$_f$CH$_2$CH$_2$O(CH$_2$CH$_2$O)$_X$H, The ZONYL® FSO-100 additive comprises less than 1% of the composition, with the relative amounts of the remaining components being as discussed above with respect to COMPOSITION 1. However, the percentage of ZONYL® FSO-100 may be greater than 1%.

An advantage provided by COMPOSITION 2 is that it abrogates the need for an a priori release layer, i.e., a separate hydrophobic and/or low surface energy release layer disposed on mold 28. Specifically, COMPOSITION 2 provides desirable release properties to mold 28 and imprinting layer 34 so that material 36c, shown in FIG. 4, does not adhere to mold 28 with sufficient force to distort the pattern recorded therein. It is believed that the ZONYL® FSO-100 becomes concentrated in a first region of material 36a, shown in FIG. 3. The polymerizable compound becomes concentrated in a second region of material 36a.

Figure 6:
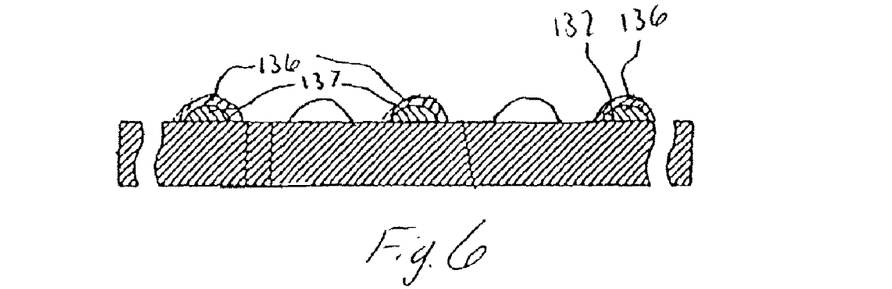
FIG. 6 is a simplified elevation view of imprint material disposed on a substrate in accordance with the present invention.
Figure 7:
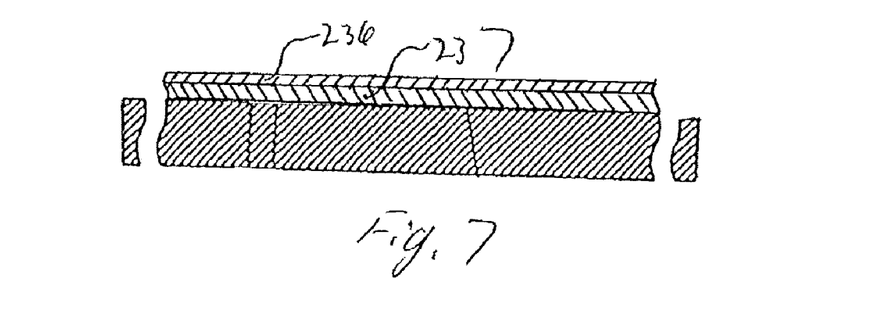
FIG. 7 is a simplified elevation view of imprint material disposed on a substrate in accordance with an alternate embodiment.

Referring to FIG. 6 droplets 36 would have a higher concentration of the ZONYL® FSO-100 additive in region 136, compared with region 137, in which the polymerizable compound is concentrated. Were spin-on techniques employed, the additive would be concentrated in a region 236, and the polymerizable compound being concentrated in region 237, shown in FIG. 7.

Figure 8:
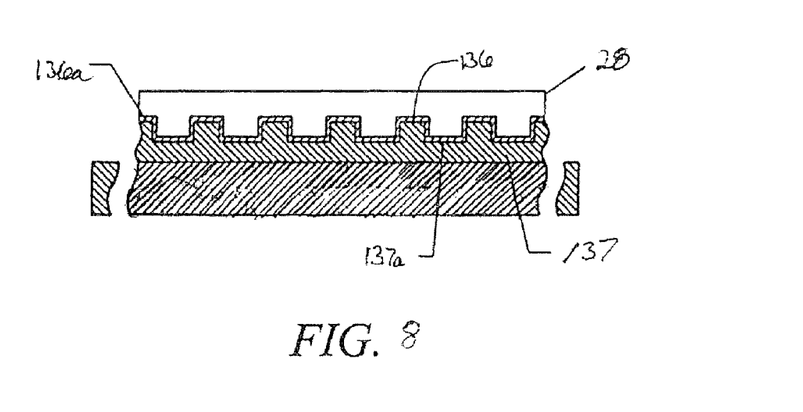
FIG. 8 is a simplified-elevation view of imprint material, shown in FIG. 6, after contact with the mold.

Referring to FIGS. 3, 4 and 8, regardless of the deposition process involved, upon contact with material 36a and exposure to actinic radiation, material 36a is transformed to material 36c and a first interface 136a is defined between region 136 and mold 28. A second interface 137a is formed between regions 136 and 137. It is believed that some portion of material 36c associated with region 136, if not all, has an affinity for the mold 28 that is greater than the attraction between that portion and the material 36c associated with region 137. As a result, upon separation of mold 28 from material 36c, a sub-section, or all of sub-portions 34a and 34b, shown in FIG. 5, separates from region 137, thereby minimizing damage to the pattern recorded in material 36c due to adhesion forces between mold 28 and material 36c.

Specifically, interface 136a defines a first interfacial energy step associated therewith, and second interface 137a defines a second interfacial energy step, with the first interfacial energy step being greater than the second interfacial energy step. The first interfacial energy step is defined by the difference in surface energy of mold 28 and surface tension of material 36c in region 136. The second interfacial surface energy is defined by the adhesion of material 36c associated with region 136 for material 36c associated with region 137. In the present example, COMPOSITION 2 provides region 136 with a surface tension in a range of 20–35 milli-Newtons/meter, with one milli-Joule/cm$^2$=1 milli-Newton/meter. As a result, the interfacial surface energy step at interface 136a is sufficiently large to overcome the interfacial energy step at interface 137.

Referring to FIG. 2, an additional advantage provided by COMPOSITION 2 is that the time required to wet mold 28 and, therefore, spread droplets 36 may be reduced. Specifically, by abrogating the need to have an a priori release layer on mold 28, the surface of mold 28 may be provided with a high surface energy, e.g., 60 to 250 milli-Newtons/meter. The wettability of the surface of mold 28 for COMPOSITION 2, as defined by the contact angle method, may be in a range of 10 degrees or less. This minimizes the time required to fill the features of the pattern on mold 28. Further, the ZONYL® FSO-100 additive provides COMPOSITION 2 with a wettability, as defined by the contact angle method, in a range of 75 to 90 degrees, thereby augmenting the wettability of mold 28, thereby further reducing the time required to spread droplets 36. Of course, COMPOSITION 2 may be employed with an a priori release layer, such as those known in the prior art, to further improve release properties.

Another manner by which to improve the release properties of mold 28 includes conditioning the pattern of mold 28 by exposing the same to a conditioning mixture including an additive that will remain on mold 28 to reduce the surface energy of the mold surface. An exemplary additive is a surfactant.

In a specific example, mold 28 was exposed to a mixture that included approximately 0.1% or more of ZONYL® FSO-100 with the remainder comprising isopropyl alcohol (IPA). Exposure of the pattern may be achieved by virtually any manner known in the art, including dipping the pattern into a volume of the conditioning mixture, wiping the pattern with a cloth saturated with the conditioning mixture and spraying a stream of the conditioning mixture onto the surface. The IPA in the conditioning mixture is then allowed to evaporate before using the mold 28. In this manner, the IPA facilitates removing, from the pattern, undesired contaminants while leaving the additive, thereby conditioning the surface of the pattern. The conditioning mixture may be employed with COMPOSITION 2 to augment improvement of the release properties provided by COMPOSITION 2. The additive in the conditioning mixture may be the same or differ from the additive in COMPOSITION 2. Alternatively, the conditioning mixture may be employed with COMPOSITION 1, or any other polymerizable material suitable for imprint lithography, as well as other imprint processes such as the hot embossing and laser assisted imprint processes.

Another technique for conditioning the pattern of mold 28 employs pattern priming. Pattern priming is achieved by selectively contacting the conformable region with the pattern a sufficient number of times to accurately reproduce, in the conformable region, a pattern complementary to the initial pattern. Specifically, it was found that by repeatably contacting imprint material 36a, shown in FIG. 3, the complementary pattern formed improves with each successive imprint. After a sufficient number of imprints, an accurate complementary reproduction of the pattern in mold 28 is formed. The pattern priming technique may be employed in combination with the aforementioned conditioning mixture and either COMPOSITION 1 or COMPOSITION 2 and, or with COMPOSITION 2, alone, i.e., COMPOSITION 2 without use of the conditioning mixture. It is believed that the number of imprints required to be produced before an accurate complementary reproduction of the pattern occurs is inversely proportional to the quantity of additive in COMPOSITION 2. Specifically, it is believed that by increasing the quantity of the additive in COMPOSITION 2 that the number of imprints required before an accurate complementary reproduction of the pattern occurs is reduced. This results from a transfer of the surfactant molecules onto the mold surface upon contact by the mold with COMPOSITION 2 resulting from the surfactant being attracted thereto by formation of hydrogen bonds with the mold.

Figure 9:
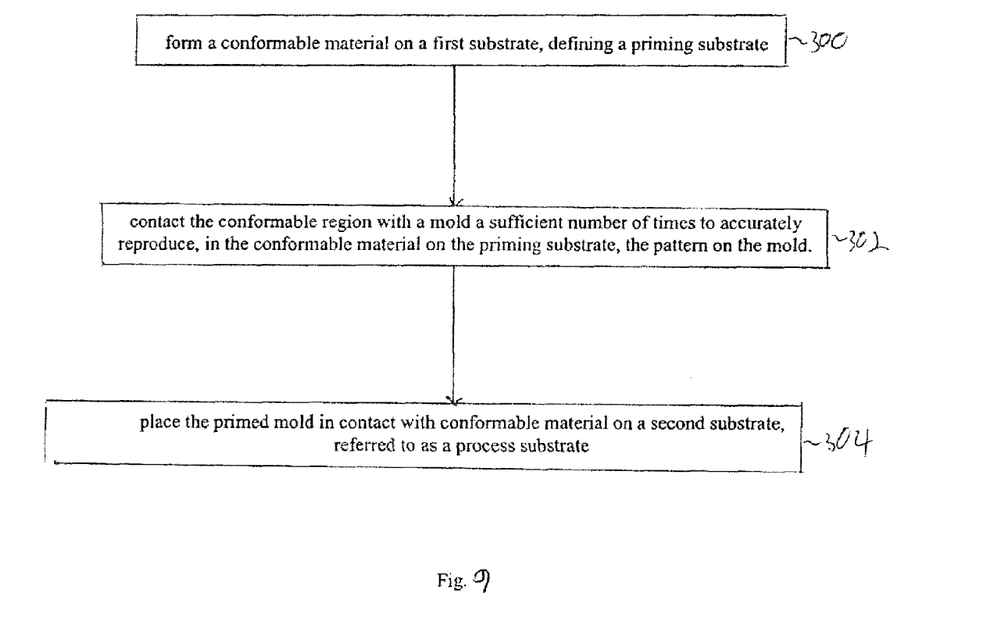
FIG. 9 is a flow diagram showing pattern priming in accordance with an alternate embodiment of the present invention.

Referring to FIGS. 2 and 9, in operation, imprint priming would include forming a conformable material on a first substrate, defining a priming substrate at step 300. At step 302, mold 28 contacts the conformable region a sufficient number of times to accurately reproduce, in the conformable material on the priming substrate, the pattern on mold 28. In one example, mold 28 is placed in contact with a first sub-portion of the conformable material. Thereafter, the first sub-portion is polymerized and mold 28 is spaced-part therefrom. Mold 28 is then placed in contact with a second sub-portion of the conformable material, which is spaced-apart from the first sub-portion. The conformable material associated with the second sub-portion is polymerized and the process is repeated until an accurate pattern is recorded in the conformable material that is complementary to the pattern on mold 28. In this manner a primed mold is generated. At step 304 the primed mold is placed in contact with conformable material on a second substrate, referred to as a process substrate. Thereafter, the pattern may be recorded therein by polymerizing the conformable material using well known imprint lithography techniques. In this manner, the primed mold may be employed to complete the patterning of the process substrate.

The embodiments of the present invention described above are exemplary. Many changes and modifications may be made to the disclosure recited above, while remaining within the scope of the invention. The scope of the invention should, therefore, be determined not with reference to the above description, but instead should be determined with reference to the appended claims along with their full scope of equivalents.

What is claimed is:

1. A method of reducing adhesion forces between a conformable material on a substrate and a mold having an initial pattern, said method comprising:
    forming said conformable material on said substrate by depositing, upon said substrate, a conformable composition having a polymerizable compound and non-ionic sufactant molecules, with said non-ionic surfactant molecules being concentrated in a first region of said conformable material with said polymerizable compound being concentrated in a second region of said conformable composition;
    contacting said conformable material with said mold; and
    solidifying said polymerizable compound, defining solidified material with said first region being positioned between said second region and said mold and a subset of said non-ionic surfactant molecules having an affinity for said mold that is greater than an affinity for said solidified material.

2. The method as recited in claim 1 further including conditioning said mold to be hydrophilic.

3. The method as recited in claim 1 further including conditioning said mold by exposing said mold to a mixture of isopropyl alcohol and said non-ionic surfactant.

4. The method as recited in claim 1 wherein forming said conformable material further includes depositing a plurality of drops of said conformable composition upon said substrate.

5. The method as recited in claim 1 wherein forming said conformable material further includes depositing said conformable composition upon said substrate employing spin-coating techniques.

6. The method as recited in claim 1 further including sequentially contacting said conformable composition a sufficient number of times to accurately reproduce, in said conformable composition, a recorded pattern complementary to said initial pattern.

7. The method as recited in claim 1 wherein forming said conformable material further includes forming said conformable composition from isobornyl acrylate, n-hexyl acrylate, ethylene glycol diacrylate and 2-hydroxy-2-methyl-1-phenyl-propan-1-one and $R_1R_2$.

8. A method of reducing adhesion forces between a substrate and a mold having a patterned region with a surface, said method comprising:
   forming a conformable material on said substrate;
   contacting said conformable material with said surface; and
   forming a conditioned layer from said conformable material having a first and second sub-portions, with said first sub-portion being solidified and said second sub-portion including a plurality of molecules, a subset of which forms hydrogen bonds with said surface generating and defining a first affinity for said surface, with the molecules of said subset having a second affinity for said first sub-portion, such that said first affinity is greater than said second affinity.

9. The method as recited in claim 8 further including conditioning said mold to be hydrophilic before contacting said conformable material.

10. The method as recited in claim 8 further including conditioning said mold by exposing said mold to a mixture of isopropyl alcohol and a surfactant before contacting said conformable material.

11. The method as recited in claim 8 wherein forming said conformable material further includes depositing a plurality of drops of said conformable composition upon said substrate.

12. The method as recited in claim 8 wherein forming said conformable material further includes depositing said conformable composition upon said substrate employing spin-coating techniques.

13. The method as recited in claim 8 further including sequentially contacting said conformable composition a sufficient number of times to accurately reproduce, in said conformable composition, a recorded pattern complementary to said initial pattern.

14. The method as recited in claim 8 wherein forming said conformable material further includes forming said conformable composition from isobornyl acrylate, n-hexyl acrylate, ethylene glycol diacrylate and 2-hydroxy-2-methyl-1-phenyl-propan-1-one and $R_1R_2$.

* * * * *